United States Patent
Mai et al.

(10) Patent No.: US 11,444,443 B2
(45) Date of Patent: Sep. 13, 2022

(54) HOUSEHOLD APPLIANCE AND APPARATUS AND METHOD FOR DETECTING ARC FAULT IN THE SAME

(71) Applicants: GD MIDEA AIR-CONDITIONING EQUIPMENT CO., LTD., Foshan (CN); MIDEA GROUP CO., LTD., Foshan (CN)

(72) Inventors: Zhiwei Mai, Foshan (CN); Zhaozhong Ruan, Foshan (CN); Biying Wang, Foshan (CN)

(73) Assignees: GD MIDEA AIR-CONDITIONING EQUIPMENT CO., LTD., Foshan (CN); MIDEA GROUP CO., LTD., Foshan (CN)

( * ) Notice: Subject to any disclaimer, the term of this patent is extended or adjusted under 35 U.S.C. 154(b) by 523 days.

(21) Appl. No.: 15/907,082

(22) Filed: Feb. 27, 2018

(65) Prior Publication Data

US 2018/0191145 A1 Jul. 5, 2018

Related U.S. Application Data

(63) Continuation of application No. PCT/CN2016/108097, filed on Nov. 30, 2016.

(30) Foreign Application Priority Data

Aug. 19, 2016 (CN) .......................... 201610695423.9
Aug. 19, 2016 (CN) .......................... 201620910252.2
(Continued)

(51) Int. Cl.
*H02H 1/00* (2006.01)
*H02H 9/00* (2006.01)
(Continued)

(52) U.S. Cl.
CPC ........... *H02H 1/0015* (2013.01); *G01R 31/12* (2013.01); *G01R 31/52* (2020.01); *H02H 1/043* (2013.01);
(Continued)

(58) Field of Classification Search
CPC ...... H02H 1/0015; H02H 9/005; H02H 3/305; H02H 1/043; G01R 31/50; G01R 31/12;
(Continued)

(56) References Cited

U.S. PATENT DOCUMENTS 5,687,070 A * 11/1997 Jacobs ................ H02M 1/4225
323/222
5,963,406 A 10/1999 Neiger et al.
(Continued)

FOREIGN PATENT DOCUMENTS

CN 1917320 A 2/2007
CN 201345457 Y 11/2009
(Continued)

OTHER PUBLICATIONS

Midea Group Co., Ltd., /Guangdong Mide Refrigeration Equipment Co. Ltd., First Office Action, CN201610695423.9, dated May 18, 2018, 20 pgs.
(Continued)

*Primary Examiner* — Jeff W Natalini
(74) *Attorney, Agent, or Firm* — Morgan, Lewis & Bockius LLP

(57) ABSTRACT

Disclosed are a household appliance, an apparatus and a method for detecting an arc fault in the household appliance. The apparatus includes: a grid current detecting unit, configured to detect a current from a power grid to the household appliance so as to generate a first current detecting signal; a filter protecting unit, configured to perform an attenuation processing on an arc signal in the power grid; a (Continued)

load current detecting unit, configured to detect an actual running current in a load of the household appliance so as to generate a second current detecting signal; and a control unit connected to the grid current detecting unit and the load current detecting unit respectively, and configured to identify and compare the first current detecting signal and second current detecting signal so as to determine a source of the arc fault.

15 Claims, 5 Drawing Sheets

(30) Foreign Application Priority Data

| Aug. 19, 2016 | (CN) | 201620910253.7 |
| Aug. 19, 2016 | (CN) | 201620910255.6 |
| Aug. 19, 2016 | (CN) | 201620910356.3 |
| Aug. 19, 2016 | (CN) | 201620913068.3 |

(51) Int. Cl.
*H02H 3/30* (2006.01)
*G01R 31/52* (2020.01)
*G01R 31/12* (2020.01)
*H02H 1/04* (2006.01)
*G01R 31/28* (2006.01)

(52) U.S. Cl.
CPC ............ *H02H 3/305* (2013.01); *H02H 9/005* (2013.01); *G01R 31/1272* (2013.01); *G01R 31/2825* (2013.01)

(58) Field of Classification Search
CPC . G01R 31/1272; G01R 31/2825; G01R 31/52
See application file for complete search history.

(56) References Cited

U.S. PATENT DOCUMENTS

| 6,999,289 | B2 | 2/2006 | Macbeth et al. | |
| 9,664,723 | B2* | 5/2017 | Krenz | G01R 31/52 |
| 2004/0109269 | A1* | 6/2004 | Kawate | H02H 1/0015 |
| | | | | 361/42 |
| 2006/0181816 | A1* | 8/2006 | Pellon | G01R 31/50 |
| | | | | 361/5 |
| 2009/0308734 | A1* | 12/2009 | Krauss | H01J 37/32935 |
| | | | | 204/192.13 |
| 2012/0139565 | A1* | 6/2012 | Ambuter | G01N 27/048 |
| | | | | 324/694 |
| 2012/0159210 | A1* | 6/2012 | Hosaka | G06F 1/3212 |
| | | | | 713/320 |
| 2016/0202304 | A1* | 7/2016 | Beierschmitt | H02H 3/20 |
| | | | | 361/42 |
| 2016/0241017 | A1* | 8/2016 | Schroeder | H02H 1/0015 |
| 2018/0097354 | A1* | 4/2018 | Yoscovich | H02S 50/00 |

FOREIGN PATENT DOCUMENTS

| CN | 103116093 | A | 5/2013 |
| CN | 203119217 | U | 8/2013 |
| CN | 103543375 | A | 1/2014 |
| CN | 104180477 | A | 12/2014 |
| CN | 105067939 | A | 11/2015 |
| CN | 105334425 | A | 2/2016 |
| CN | 105425082 | A | 3/2016 |
| CN | 105675966 | A | 6/2016 |
| CN | 106054009 | A | 10/2016 |
| CN | 205982470 | U | 2/2017 |
| CN | 205982525 | U | 2/2017 |
| CN | 205982530 | U | 2/2017 |
| CN | 206002615 | U | 3/2017 |
| CN | 206002638 | U | 3/2017 |
| DE | 4316239 | A1 | 11/1994 |

OTHER PUBLICATIONS

Midea, International Search Report and Written Opinion, PCT/CN2016/108097, dated May 3, 2018, 17 pgs.
MIDEA Air Conditioning Equipment Co., Ltd., et al., European Application No. 16888595.2, Extended European Search Report, Mar. 12, 2020, 8 pgs.

* cited by examiner

HOUSEHOLD APPLIANCE AND APPARATUS AND METHOD FOR DETECTING ARC FAULT IN THE SAME

PRIORITY CLAIM AND RELATED APPLICATION

This application is a continuation application of PCT/CN2016/108097, entitled "HOUSEHOLD APPLIANCE AND APPARATUS AND METHOD FOR DETECTING ARC FAULT IN THE SAME" filed on Nov. 30, 2016, which claims priority to (i) Chinese Patent Application No. 201610695423.9, filed with the State Intellectual Property Office of the People's Republic of China on Aug. 19, 2016, (ii) Chinese Patent Application No. 201620910252.2, filed with the State Intellectual Property Office of the People's Republic of China on Aug. 19, 2016, (iii) Chinese Patent Application No. 201620910253.7, filed with the State Intellectual Property Office of the People's Republic of China on Aug. 19, 2016, (iv) Chinese Patent Application No. 201620910255.6, filed with the State Intellectual Property Office of the People's Republic of China on Aug. 19, 2016, (v) Chinese Patent Application No. 201620910356.3, filed with the State Intellectual Property Office of the People's Republic of China on Aug. 19, 2016, and (vi) Chinese Patent Application No. 201620913068.3, filed with the State Intellectual Property Office of the People's Republic of China on Aug. 19, 2016, all of which are incorporated herein by reference in their entirety.

TECHNICAL FIELD

The present disclosure relates to a field of household appliance technology, and more particularly relates to an apparatus for detecting an arc fault in a household appliance, a household appliance, and a method for detecting an arc fault in a household appliance.

BACKGROUND

Arc fault is a kind of dangerous and multiple electrical fault. Insulating layers of electrical circuits and electrical equipment may be aged and damaged after a long time overload running or in case of existing a poor electrical connection etc., which may cause an arc fault. When the arc fault occurs, an arc current of 2-10 A may generate a partial high temperature ranging from 2000° C. to 4000° C. in a short time. Thus, the arc fault may cause a security problem for the electrical equipment.

Once the arc fault occurs in the electrical equipment, high frequency noise of 200-400 kHz may appear in the waveform of the running current, and some loads may cause a flat shoulder in the current waveform. In common detecting methods, the arc fault may be determined by identifying the high frequency component in the current waveform. However, the high frequency component may appear in the current waveform of the power grid near the electrical equipment once the arc fault is generated. Thus, it is difficult to determine a source of the arc fault, and a misoperation of other equipment may be caused, which bring inconvenience for the user. Moreover, a sampling circuit for sampling the current waveform is not only expensive, but also lack of instantaneity, reliability and accuracy.

SUMMARY

Embodiments of the present disclosure seek to solve at least one of the problems existing in the related art to at least some extent. Accordingly, a first objective of the present disclosure is to provide an apparatus for detecting an arc fault in a household appliance. The apparatus is able to determine the source of the arc fault precisely and to avoid misoperation efficiently.

A second objective of the present disclosure is to provide a method for detecting an arc fault in a household appliance. A third objective of the present disclosure is to provide a household appliance.

In order to achieve the above objectives, embodiments of the first aspect of the present disclosure provide an apparatus for detecting an arc fault in a household appliance, including: a grid current detecting unit, configured to detect a current flowing to the household appliance from a power grid so as to generate a first current detecting signal; a filter protecting unit, configured to perform an attenuation processing on an arc signal in the power grid; a load current detecting unit, configured to detect an actual running current in a load of the household appliance so as to generate a second current detecting signal; and a control unit connected to the grid current detecting unit and the load current detecting unit respectively, and configured to identify and compare the first current detecting signal and second current detecting signal so as to determine a source of the arc fault.

With the apparatus for detecting an arc fault in a household appliance according to embodiments of the present disclosure, a current flowing to the household appliance from the power grid may be detected by a grid current detecting unit, such that a first current detecting signal may be generated; an attenuation processing may be performed by a filter protecting unit on an arc signal in the power grid; an actual running current in a load of the household appliance may be detected by a load current detecting unit, such that a second current detecting signal may be generated. In this way, the first current detecting signal and second current detecting signal may be identified and compared by a control unit, which means that the current waveform from the power grid and the actual current waveform in the load may be compared, such that a source of the arc fault may be determined precisely (i.e., whether the arc fault is generated by the external power grid or the internal load can be determined), thus avoiding the misoperation of the household appliance efficiently and reducing the influence for the user.

According to an embodiment of the present disclosure, the control unit is further configured to identify a first arc signal according to the first current detecting signal, and to identify a second arc signal according to the second current detecting signal, in which the control unit is configured to determine that the arc fault is generated by the power grid if a strength of the first arc signal is greater than that of the second arc signal; and the control unit is configured to determine that the arc fault is generated by the load if the strength of the first arc signal is less than that of the second arc signal.

According to an embodiment of the present disclosure, the apparatus further includes a controllable switch unit, in which a first terminal of the controllable switch unit is configured to be connected to the power grid, a second terminal of the controllable switch unit is connected to an input end of the filter protecting unit, output ends of the filter protecting unit are connected to the load, a control terminal of the controllable switch unit is connected to the control unit, and the control unit is further configured to control the controllable switch unit to switch off if the art fault is generated by the load, so as to enable the household appliance to be powered off The controllable switch unit includes a relay including a release and a control coil, in which the release is connected to a fire line and a neutral line of the power grid respectively, the control coil is connected to the control unit, and the release is a normally-closed contact.

According to an embodiment of the present disclosure, the filter protecting unit includes a low pass filter, in which the low pass filter is one of an LC filter circuit, an LCL filter circuit, a CLC filter circuit and a CLLC filter circuit.

According to an embodiment of the present disclosure, the CLC filter circuit includes: a first X capacitor connected between the fire line and the neutral line of the power grid in parallel; a first differential mode inductor, in which the first terminal of the first differential mode inductor is connected to the first terminal of the first X capacitor; and a second X capacitor connected between the second terminal of the first differential mode inductor and the second terminal of the first X capacitor, in which two terminals of the second X capacitor are configured as the output ends of the filter protecting unit.

Moreover, the filter protecting unit further includes a first piezoresistor configured to prevent a surge, the first piezoresistor is connected between the fire line and the neutral line of the power grid in parallel and is connected to the first X capacitor in parallel.

According to an embodiment of the present disclosure, the CLLC filter circuit includes: a third X capacitor connected between the fire line and the neutral line of the power grid in parallel; a second differential mode inductor, in which the first terminal of the second differential mode inductor is connected to the first terminal of the third X capacitor; a third differential mode inductor, in which the first terminal of the third differential mode inductor is connected to the second terminal of the third X capacitor; and a fourth X capacitor connected between the second terminal of the second differential mode inductor and the second terminal of the third differential mode inductor, in which two terminals of the fourth X capacitor are configured as the output ends of the filter protecting unit.

Moreover, the filter protecting unit further includes a second piezoresistor configured to prevent a surge, the second piezoresistor is connected between the fire line and the neutral line of the power grid in parallel and is connected to the third X capacitor in parallel.

According to an embodiment of the present disclosure, a circuit configuration of the grid current detecting unit is the same as the circuit configuration of the load current detecting unit.

Moreover, the load current detecting unit includes a current transformer, a current detecting resistor or a Hall current detecting chip.

According to an embodiment of the present disclosure, when the load current detecting unit includes the Hall current detecting chip, the load current detecting unit further includes: a first filtering capacitor, in which the first terminal of the first filtering capacitor is connected to the control unit and an output terminal of the Hall current detecting chip respectively, and the second terminal of the first filtering capacitor is grounded; a fourth filtering capacitor connected between a preset power supply and the ground, in which the preset power supply is connected to a power terminal of the Hall current detecting chip; and a fifth filtering capacitor connected between a filtering terminal of the Hall current detecting chip and a ground terminal of the Hall current detecting chip.

According to an embodiment of the present disclosure, when the load current detecting unit includes the current detecting resistor, the load current detecting unit further includes: a differential isolation amplifier connected between two terminals of the current detecting resistor, in which the power terminal of the differential isolation amplifier is connected to the preset power supply, and the ground terminal of the differential isolation amplifier is grounded; a second filtering capacitor, in which the first terminal of the second filtering capacitor is connected to the control unit and an output terminal of the differential isolation amplifier respectively, and the second terminal of the second filtering capacitor is grounded; and a third filtering capacitor connected between the preset power supply and the ground.

Moreover, the load current detecting unit further includes: a first common-mode filtering resistor, in which the first terminal of the first common-mode filtering resistor is connected to the first terminal of the current detecting resistor, and the second terminal of the first common-mode filtering resistor is connected to a first input terminal of the differential isolation amplifier; a second common-mode filtering resistor, in which the first terminal of the second common-mode filtering resistor is connected to the second terminal of the current detecting resistor, and the second terminal of the second common-mode filtering resistor is connected to a second input terminal of the differential isolation amplifier; a common-mode filtering capacitor, in which the first terminal of the common-mode filtering capacitor is connected to the second terminal of the first common-mode filtering resistor and the first input terminal of the differential isolation amplifier respectively, and the second terminal of the common-mode filtering capacitor is connected to the second terminal of the second common-mode filtering resistor and the second input terminal of the differential isolation amplifier respectively; a first differential-mode filtering capacitor, in which the first terminal or the first differential-mode filtering capacitor is connected to the first terminal of the common-mode filtering capacitor, and the second terminal of the first differential-mode filtering capacitor is grounded; and a second differential filtering capacitor, in which the first terminal of the second differential-mode filtering capacitor is connected to the second terminal of the common-mode filtering capacitor, and the second terminal of the second differential-mode filtering capacitor is grounded.

According to an embodiment of the present disclosure, when the load current detecting unit includes a current transformer, the load current detecting unit further includes: a sixth filtering capacitor connected to an induction coil of the current transformer in parallel, in which the current transformer is connected to the fire line of the power grid in series; a sampling resistor connected to the sixth filtering capacitor in parallel; a first divider resistor and a second divider resistor, in which the first divider resistor and the second divider resistor are connected in series and are connected between a preset power supply and the ground, a node between the first divider resistor and the second divider resistor is connected to the first terminal of the sampling resistor, and the second terminal of the sampling resistor is connected to the control unit; and a seventh filtering capacitor connected to the second divider resistor in parallel.

Moreover, the load current detecting unit also includes: an eighth filtering capacitor, in which the first terminal of the eighth filtering capacitor is connected to the control unit and the second terminal of the sampling resistor respectively, and the second terminal of the eighth filtering capacitor is grounded; and a ninth filtering capacitor connected between the preset power supply and the ground so as to be connected in parallel to the first divider resistor and the second divider resistor connected in series.

According to an embodiment of the present disclosure, a resistance value of the first divider resistor is the same as that of the second divider resistor.

According to an embodiment of the present disclosure, the apparatus further includes a switch power supply, in which an input terminal of the switch power supply is connected to the output end of the filtering protecting unit, the output terminal of the switch power supply is connected to the control unit, and the switch power supply is configured to supply a direct current to the control unit.

According to an embodiment of the present disclosure, the apparatus is integratable in a plug of the household appliance.

In order to achieve the above objectives, embodiments of the second aspect of the present disclosure provide a method for detecting an arc fault in a household appliance, including: detecting a current flowing to the household appliance from a power grid so as to generate a first current detecting signal; filtering the current flowing to the household appliance from the power grid so as to perform an attenuation processing on an arc signal in the power grid; detecting an actual running current in a load of the household appliance so as to generate a second current detecting signal; and identifying and comparing the first current detecting signal and second current detecting signal so as to determine a source of the arc fault.

With the method for detecting an arc fault in a household appliance according to embodiments of the present disclosure, a current flowing to the household appliance from the power grid may be detected so as to generate a first current detecting signal and an actual running current in a load of the household appliance may be detected so as to generate a second current detecting signal, in which an attenuation processing may be performed on an arc signal in the power grid. In this way, the first current detecting signal and second current detecting signal may be identified and compared, which means that the current waveform from the power grid and the actual current waveform in the load may be compared, such that a source of the arc fault may be determined precisely (i.e., whether the arc fault is generated by the external power grid or the internal load can be determined), thus avoiding the misoperation on the household appliance efficiently and reducing the influence for the user.

According to an embodiment of the present disclosure, identifying and comparing the first current detecting signal and second current detecting signal so as to determine a source of the arc fault includes: identifying a first arc signal according to the first current detecting signal, and identifying a second arc signal according to the second current detecting signal; determining that the arc fault is generated by the power grid if a strength of the first arc signal is greater than that of the second arc signal; and determining that the arc fault is generated by the load if the strength of the first arc signal is less than that of the second arc signal.

The method further includes: controlling the household appliance to be powered off if the art fault is generated by the load.

Furthermore, the present disclosure also provides a household appliance, including the apparatus for detecting an arc fault in a household appliance mentioned above.

With the household appliance provided in the present disclosure, the current waveform from the power grid and the actual current waveform in the load may be compared by the above-described apparatus, such that a source of the arc fault may be determined precisely, which means that it may be determined whether the arc fault is generated by the external power grid or the internal load, such that the misoperation may be avoided efficiently and the influence for the user may be reduced.

DETAILED DESCRIPTION

Figure 1:
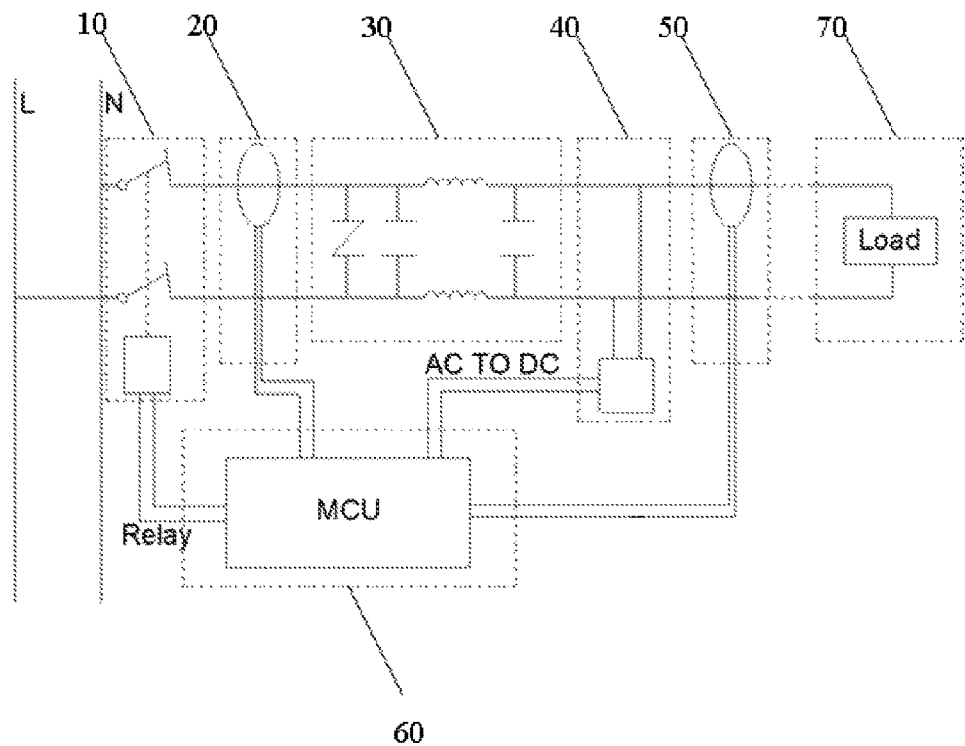
FIG. 1 is a schematic diagram of an apparatus for detecting an arc fault in a household appliance according to an embodiment of the present disclosure.

Reference will be made in detail to embodiments of the present disclosure, where the same or similar elements and the elements having same or similar functions are denoted by like reference numerals throughout the descriptions. The embodiments described herein with reference to drawings are explanatory, illustrative, and used to generally understand the present disclosure. The embodiments shall not be construed to limit the present disclosure.

An apparatus and a method for detecting an arc fault in a household appliance and a household appliance equipped with the apparatus for detecting an arc fault in the household appliance will be described with reference to the drawings.

FIG. 1 is a schematic diagram of an apparatus for detecting an arc fault in a household appliance according to an embodiment of the present disclosure. As shown in FIG. 1, the apparatus includes a grid current detecting unit 20, a filter protecting unit 30, a load current detecting unit 50 and a control unit 60.

The grid current detecting unit 20 is connected to a power terminal of the household appliance and is configured to detect a current flowing to the household appliance from the power grid so as to generate a first current detecting signal. A front terminal of the filter protecting unit 30 is connected to the grid current detecting unit 20 and is configured to perform an attenuation processing on an arc signal in the power grid. A rear terminal of the load current detecting unit 50 is connected to a load 70 and is configured to detect an actual running current in the load of the household appliance so as to generate a second current detecting signal. The control unit 60 is connected to the grid current detecting unit 20 and the load current detecting unit 50 respectively and is configured to identify and compare the first current detecting signal and second current detecting signal so as to determine a source of the arc fault. Therefore, it may be determined whether the arc fault is generated by the outside power grid or the inside load, such that the misoperation may be avoided efficiently.

In one example of the present disclosure, the control unit 60 may be an MCU (Micro Controller Unit).

According to an embodiment of the present disclosure, the control unit 60 such as the MCU is further configured to identify a first arc signal according to the first current detecting signal, and to identify a second arc signal according to the second current detecting signal, in which the control unit 60 is configured to determine that the arc fault is generated by the power grid if a strength of the first arc signal is greater than that of the second arc signal; and the control unit 60 is configured to determine that the arc fault is generated by the load if the strength of the first arc signal is less than that of the second arc signal.

In other words, the control unit 60 is configured to compare the current waveform generated from the power grid and detected by the grid current detecting unit 20 with the current waveform generated from the load and detected by the load current detecting unit 50. The control unit 60 determines that the arc fault is generated by the outside power grid if the arc signal in the current waveform generated from the power grid and detected by the grid current detecting unit 20 is stronger than the arc signal in the current waveform generated from the load and detected by the load current detecting unit 50, otherwise, the control unit 60 determines that the arc fault is generated by the inside load. Therefore, the source of the arc fault may be determined precisely.

According to an embodiment of the present disclosure, as shown in FIG. 1, the above-mentioned apparatus also includes a controllable switch unit 10. A first terminal of the controllable switch unit 10 is connected to the power grid, a second terminal of the controllable switch unit 10 is connected to an input end of the filter protecting unit 30. Output ends of the filter protecting unit 30 are connected to the load 70. A control terminal of the controllable switch unit 10 is connected to the control unit 60. The control unit 60 is further configured to control the controllable switch unit 10 to switch off if the arc fault is generated by the load, such that the household appliance is powered off and the security of the household appliance is ensured.

Moreover, as shown in FIG. 1, the controllable switch unit 10 includes a relay. The relay includes a release and a control coil, in which the release is connected to a fire line L and a neutral line N of the power grid respectively, the control coil is connected to the control unit 60, and the release is a normally-closed contact. In other words, the relay is a normally-closed relay.

In embodiments of the present disclosure, the filter protecting unit 30 includes a low pass filter, which mainly plays a role of low-pass filtering, in which the low pass filter is one of an LC filter circuit, an LCL filter circuit, a CLC filter circuit or a CLLC filter circuit.

The filter protecting unit further includes a first piezoresistor configured to prevent a surge, such that the apparatus is protected from damage by the surge.

According to an embodiment of the present disclosure, as shown in FIG. 1, the apparatus further includes a switch power supply 40, in which an input terminal of the switch power supply 40 is connected to the output end of the filtering protecting unit 30, the output terminal of the switch power supply 40 is connected to the control unit 60, and the switch power supply 40 is configured to perform an AC/DC conversion and to supply a direct current to the control unit 60.

In embodiments of the present disclosure, the apparatus may be integrated in a plug of the household appliance, which is a convenient design. The household appliance may be an air conditioner.

With the apparatus for detecting an arc fault in a household appliance according to embodiments of the present disclosure, a current flowing to the household appliance from the power grid may be detected by a grid current detecting unit, such that a first current detecting signal may be generated; an attenuation processing may be performed by a filter protecting unit on an arc signal in the power grid; an actual running current in a load of the household appliance may be detected by a load current detecting unit, such that a second current detecting signal may be generated. In this way, the first current detecting signal and second current detecting signal may be identified and compared by a control unit, which means that the current waveform from the power grid and the actual current waveform in the load may be compared, such that a source of the arc fault may be determined precisely (i.e., whether the arc fault is generated by the outside power grid or the inside load can be determined), thus avoiding the misoperation of the household appliance efficiently and reducing the influence for the user.

Specifically, according to an embodiment of the present disclosure, as shown in FIG. 1, the low pass filter in the filter protecting unit 30 adopts a CLLC filter circuit, in which the piezoresistor is connected to the input terminal of the CLLC filter circuit in parallel. In other words, the apparatus for detecting an arc fault in the household appliance in this embodiment includes the filter protecting unit 30, the grid current detecting unit 20, the load current detecting unit 50, the control unit 60, the controllable switch unit 10 and the switch power supply 40.

The release in the controllable switch unit 10 is connected to the fire line L and the neutral line N of the power grid respectively, in which the release is a normally-closed contact. The control coil is connected to the control unit 60. When it is detected that the arc fault is generated by the load, the control unit 60 supplies power for the control coil, such that the release works to disconnect from the neutral line and the fire line, thus powering off the household appliance such as an air conditioner, and ensuring the security of the household appliance.

As shown in FIG. 1, the rear terminal of the release is connected to the grid current detecting unit 20. The grid current detecting unit 20 is configured to detect the current waveform of the current flowing to the household appliance from the power grid. A front terminal (i.e., an input end) of the filter protecting unit 30 is connected to the grid current detecting unit 20, a rear terminal (i.e., an output end) of the filter protecting unit 30 is connected to the switch power supply 40 and the load current detecting unit 50 respectively, and the rear terminal of the load current detecting unit 50 is connected to the load 70. The load current detecting unit 50 is configured to detect the current waveform of the actual running current in the load. The output terminal of the switch power supply 40 is connected to the control unit 60 and is configured to supply power for the control unit 60. The grid current detecting unit 20 and the load current detecting unit 50 are connected to the control unit 60 respectively, and the control unit 60 may acquire current signals in two paths by performing an ADC collecting.

As shown in FIG. 1, the filter protecting unit 30 mainly has a low pass filtering function, which may not only improve the stability of the switch power supply 40, but also attenuate high frequency arc signal flowing through the filter protecting unit 30 (i.e., perform an attenuation processing on the arc signal from the power grid). The control unit 60 may determine whether the arc fault is generated by the outside power grid or the inside load precisely by comparing the current waveform detected by the grid current detecting unit 20 with that detected by the load current detecting unit 50. It is determined that the arc fault is generated by the outside power grid if the arc signal in the current waveform detected by the grid current detecting unit 20 is stronger than the arc signal in the current waveform detected by the load current detecting unit 50, otherwise, it is determined that the arc fault is generated by the load side. Therefore, the source of the arc fault may be determined precisely, such that the malfunction of the household appliance may be avoided effectively and the influence for the user may be reduced.

Figure 2:
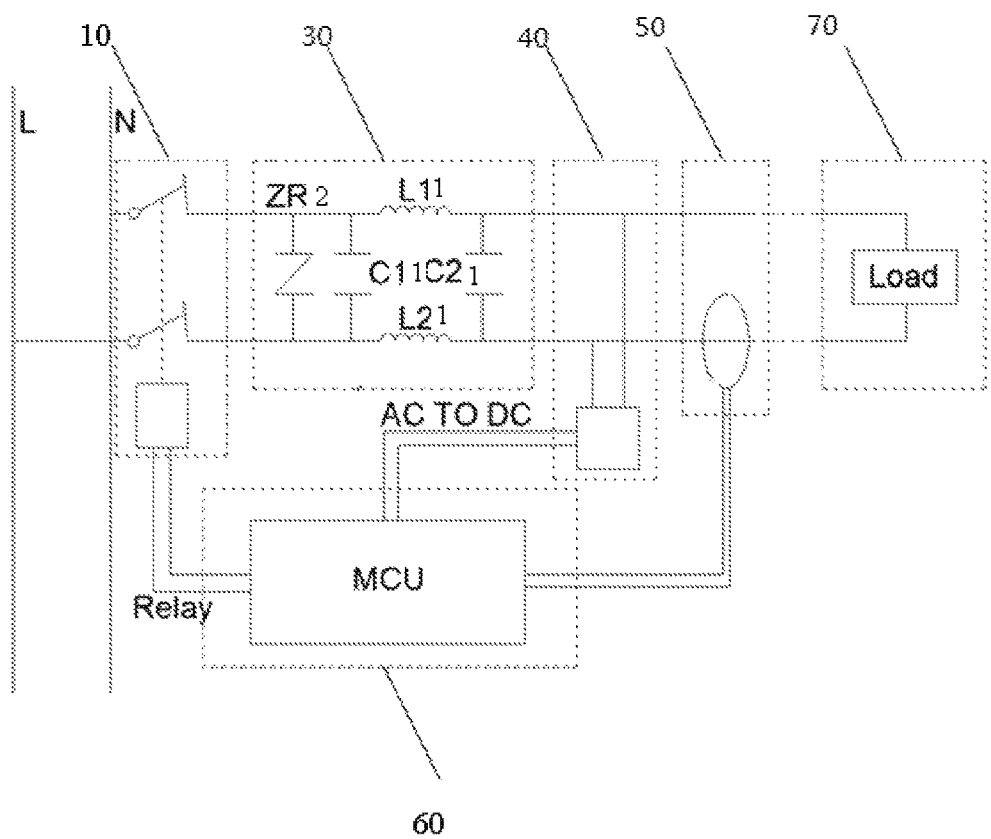
FIG. 2 is a schematic diagram of an apparatus for detecting an arc fault in a household appliance according to another embodiment of the present disclosure.

According to another embodiment of the present disclosure, as shown in FIG. 2, the apparatus includes a controllable switch unit 10, a filter protecting unit 30, a switch power supply 40, a load current detecting unit 50 and a control unit 60. The release in the controllable switch unit 10 is connected to the fire line L and the neutral line N of the power grid, in which the release is a normally-closed contact. The control coil is connected to the control unit 60. A front terminal (i.e., an input terminal) of the filter protecting unit 30 is connected to the release, a rear terminal (i.e., an output terminal) of the filter protecting unit 30 is connected to the switch power supply 40 and the load current detecting unit 50 respectively. The filter protecting unit 30 is configured to filter an arc interference signal in the power grid, which not only ensures a stable working of the switch power supply 40, but also prevents the load current detecting unit 50 from detecting the arc signal from the power grid.

As shown in FIG. 2, the output terminal of the switch power supply 40 is connected to the control unit 60 so as to supply power for the control unit 60. The load current detecting unit 50 is connected to the control unit 60, the rear terminal of the load current detecting unit 50 is connected to the load 70, the control unit 60 is configured to collect a load current signal via an ADC collecting port and to judge whether the arc fault exists by analyzing the current waveform. The control unit 60 is configured to supply power for the control coil if the arc fault exists (i.e., the arc fault is generated by the load). Thus, the release works to disconnect from the neutral line N and the fire line L, such that the household appliance such as an air conditioner is powered off, and the security of the household appliance may be ensured.

Therefore, with the apparatus for detecting an arc fault in a household appliance in this embodiment, the arc interference signal in the power grid may be filtered out effectively by the filter protecting unit 30. Thus, only the arc signal generated by the load is detected without influence of the power grid, such that the malfunction of the household appliance may be avoided efficiently and the influence for the user may be reduced.

The filter protecting unit 30 also adopts the CLLC high-order low-pass filter circuit. As shown in FIG. 2, the CLLC filter circuit includes: a third X capacitor C11, a second differential mode inductor L11, a third differential mode inductor L21 and a fourth X capacitor C21. The third X capacitor C11 is connected between the fire line and the neutral line of the power grid in parallel. The first terminal of the second differential mode inductor L11 is connected to the first terminal of the third X capacitor C11. The first terminal of the third differential mode inductor L21 is connected to the second terminal of the third X capacitor C11. The fourth X capacitor C21 is connected between the second terminal of the second differential mode inductor L11 and the second terminal of the third differential mode inductor L21, in which two terminals of the fourth X capacitor C21 are configured as the output ends of the filter protecting unit 30.

Moreover, the filter protecting unit 30 further includes a second piezoresistor ZR2 configured to prevent a surge. The second piezoresistor ZR2 is connected between the fire line and the neutral line of the power grid in parallel, and is connected to the third X capacitor C11 in parallel.

In other words, the filter protecting unit 30 includes the piezoresistor ZR2, X capacitors C11 and C21, differential mode inductors L11 and L21, in which the piezoresistor ZR2 is configured to protect the apparatus from damage by a surge, and X capacitors C11 and C21 and differential mode inductors L11 and L21 form the CLLC filter circuit for filtering the arc signal in the power grid effectively.

With the apparatus for detecting an arc fault in a household appliance according to embodiments of the present disclosure, the arc signal in the outside power grid may be shielded by performing an attenuation processing by the filter protecting unit on an arc signal in the power grid. Thus, when the load current detecting unit detects the actual running current in the load of the household appliance, the arc signal in the outside power grid may not be detected and only the arc signal generated by the load may be detected, such that whether the arc fault exists may be determined without the influence of the outside power grid, thus avoiding the malfunction of the household appliance efficiently and reducing the influence for the user.

Figure 3:
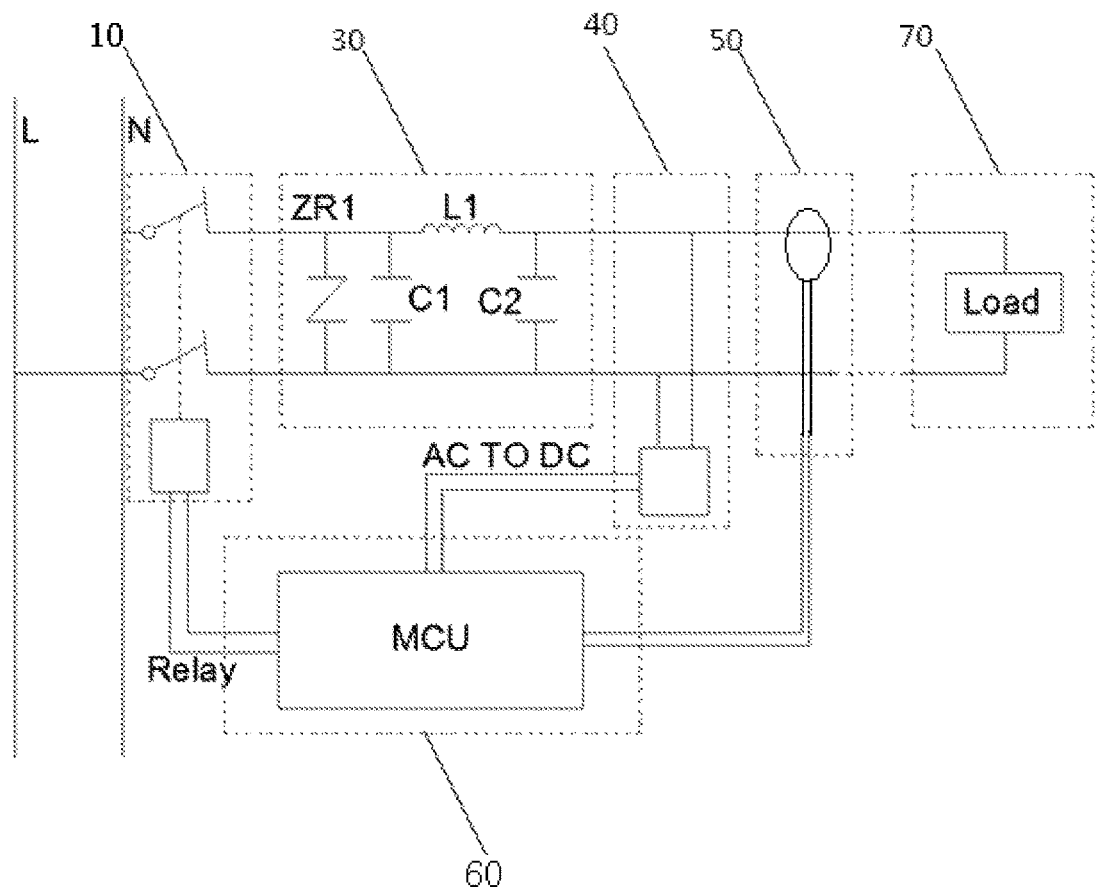
FIG. 3 is a schematic diagram of an apparatus for detecting an arc fault in a household appliance according to yet another embodiment of the present disclosure.

According to yet another embodiment of the present disclosure, as shown in FIG. 3, the apparatus includes a controllable switch unit 10, a filter protecting unit 30, a switch power supply 40, a load current detecting unit 50 and a control unit 60. The release in the controllable switch unit 10 is connected to the fire line L and the neutral line N of the power grid, in which the release is a normally-closed contact, and the control coil is connected to the control unit 60. A front terminal (i.e., an input terminal) of the filter protecting unit 30 is connected to the release, a rear terminal (i.e., an output terminal) of the filter protecting unit 30 is connected to the switch power supply 40 and the load current detecting unit 50. The filter protecting unit 30 is configured to filter an arc interference signal in the power grid, which not only ensures a stable working of the switch power supply 40, but also prevents the load current detecting unit 50 from detecting the arc signal from the power grid.

As shown in FIG. 3, the output terminal of the switch power supply 40 is connected to the control unit 60 so as to supply power for the control unit 60. The load current detecting unit 50 is connected to the control unit 60, the rear terminal of the load current detecting unit 50 is connected to the load 70, the control unit 60 is configured to collect a load current signal via an ADC collecting port and to judge whether the arc fault exists by analyzing the current waveform. The control unit 60 is configured to supply power for the control coil if the arc fault exists (i.e., the arc fault is generated by the load), such that the release works to disconnect from the neutral line and the fire line, thus powering off the household appliance such as an air conditioner, and ensuring the security of the household appliance.

Therefore, with the apparatus for detecting an arc fault in a household appliance in this embodiment, the arc interference signal in the power grid may be filtered effectively by the filter protecting unit 30. Thus, only the arc signal generated by the load is detected without influence of the power grid, such that the malfunction of the household appliance may be avoided efficiently and the influence for the user may be reduced.

The filter protecting unit 30 also adopts the CLC π-type second-order low-pass filter circuit. As shown in FIG. 3, the CLC filter circuit includes: a first X capacitor C1, a first differential mode inductor L1 and a second X capacitor C2. The first X capacitor C1 is connected between the fire line and the neutral line of the power grid in parallel. The first terminal of the first differential mode inductor L1 is connected to the first terminal of the first X capacitor C1. The second X capacitor C2 is connected between the second terminal of the first differential mode inductor L1 and the second terminal of the first differential mode inductor L1, in which two terminals of the second X capacitor C2 are configured as the output ends of the filter protecting unit 30.

Moreover, the filter protecting unit 30 further includes a first piezoresistor ZR1 configured to prevent a surge. The first piezoresistor ZR1 is connected between the fire line and the neutral line of the power grid in parallel, and is connected to the first X capacitor C1 in parallel.

In other words, the filter protecting unit 30 includes the piezoresistor ZR1, X capacitors C1 and C2, and the differential mode inductor L1, in which the piezoresistor ZR1 is configured to protect the apparatus from damage by a surge, and X capacitors C1 and C2 and the differential mode inductor L1 form the CLC filter circuit for filtering the arc signal in the power grid effectively. Furthermore, the load current detecting unit 50 detects the current in the branch of the differential mode inductor L1.

With the apparatus for detecting an arc fault in a household appliance according to embodiments of the present disclosure, the arc signal in the outside power grid may be shielded by performing an attenuation processing with the CLC π-type second-order low-pass filter circuit in the filter protecting unit on the arc signal in the power grid. Thus, when the load current detecting unit detects the actual running current in the load of the household appliance, the arc signal in the outside power grid may not be detected and only the arc signal generated by the load may be detected, such that whether the arc fault exists may be determined without the influence of the outside power grid, thus avoiding the malfunction of the household appliance efficiently and reducing the influence for the user.

According to an embodiment of the present disclosure, a circuit configuration of the grid current detecting unit 20 may be same as the circuit configuration of the load current detecting unit 50, in which the load current detecting unit 50 may include a current transformer, a current detecting resistor or a Hall current detecting chip.

Figure 4:
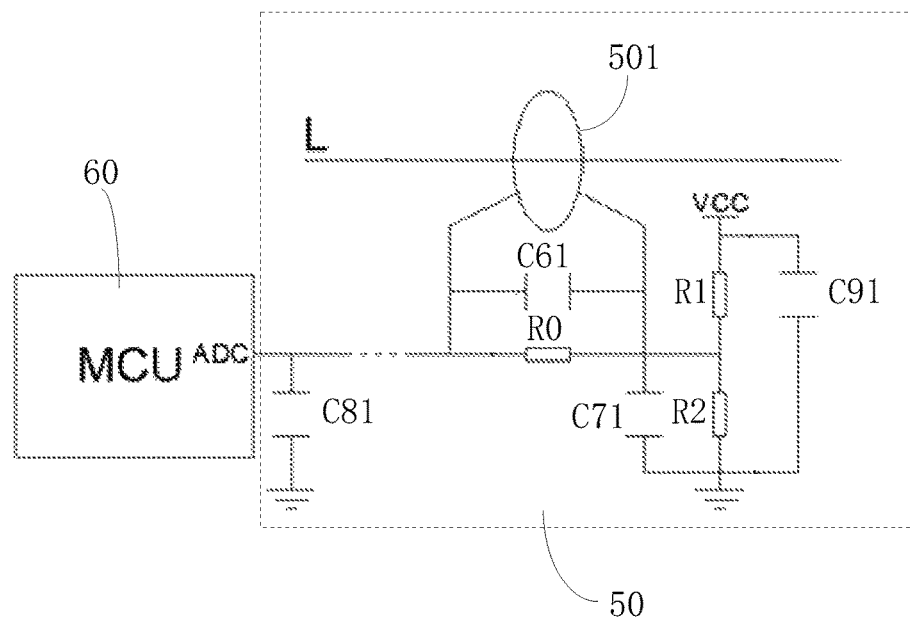
FIG. 4 is a schematic diagram showing a circuit of a load current detecting unit according to an embodiment of the present disclosure.

Specifically, in an embodiment of the present disclosure, if the load current detecting unit 50 adopts the current transformer, referring to FIG. 2 and FIG. 4, the apparatus for detecting an arc fault in the household appliance includes the filter protecting unit 30, the load current detecting unit 50, the control unit 60, the controllable switch unit 10 and the switch power supply 40. As shown in FIG. 2, a front terminal of the release in the controllable switch unit 10 is connected to the fire line L and the neutral line N of the power grid, in which the release is a normally-closed contact, and the control coil is connected to the control unit 60. A front terminal (i.e., an input terminal) of the filter protecting unit 30 is connected to the release, a rear terminal (i.e., an output terminal) of the filter protecting unit 30 is connected to the switch power supply 40 and the load current detecting unit 50. The filter protecting unit 30 is configured to filter an arc interference signal in the power grid, which not only ensures a stable working of the switch power supply 40, but also prevents the load current detecting unit 50 from detecting the arc signal from the power grid.

As shown in FIG. 2, the output terminal of the switch power supply 40 is connected to the control unit 60 so as to supply power for the control unit 60. The load current detecting unit 50 is connected to the control unit 60, the rear terminal of the load current detecting unit 50 is connected to the load 70, the control unit 60 is configured to collect a load current signal via an ADC collecting port and to judge whether the arc fault exists by analyzing the current waveform. The control unit 60 is configured to supply power for the control coil if the arc fault exists (i.e., the arc fault is generated by the load), such that the release works to disconnect from the fire line and the neutral line, thus powering off the household appliance such as the air conditioner, and ensuring the security of the household appliance.

Therefore, with the apparatus for detecting an arc fault in a household appliance in this embodiment, the arc interference signal in the power grid may be filtered effectively by the filter protecting unit 30. Thus, only the arc signal generated by the load is detected without influence of the power grid, such that the malfunction of the household appliance may be avoided efficiently and the influence for the user may be reduced.

Further, as shown in FIG. 4, if the load current detecting unit 50 includes the current transformer 501, the load current detecting unit 50 further includes: a sixth filtering capacitor C61, a sampling resistor R0, a first divider resistor R1 and a second divider resistor R2, and a seventh filtering capacitor C71. The sixth filtering capacitor C61 is connected to an induction coil of the current transformer 501 in parallel, in which the current transformer 501 is connected to the fire line of the power grid in series. The sampling resistor R0 is connected to the sixth filtering capacitor C61 in parallel. The first divider resistor R1 and the second divider resistor R2 are connected in series and are connected between a preset power supply VCC and the ground, a node between the first divider resistor R1 and the second divider resistor R2 is connected to the first terminal of the sampling resistor R0, and the second terminal of the sampling resistor R0 is connected to the control unit 60. The seventh filtering capacitor C71 is connected to the second divider resistor R2 in parallel.

Moreover, in an embodiment of the present disclosure, the load current detecting unit 50 further includes: an eighth filtering capacitor C81 and a ninth filtering capacitor C91. The first terminal of the eighth filtering capacitor C81 is connected to the control unit 60 and the second terminal of the sampling resistor R0 respectively, and the second terminal of the eighth filtering capacitor C81 is grounded. The ninth filtering capacitor C91 is connected between the preset power supply VCC and the ground so as to be connected in parallel to the first divider resistor R1 and the second divider resistor R2 connected in series.

In other words, the load current detecting unit 50 may include: the current transformer 501, the sixth filtering capacitor C61, the seventh filtering capacitor C71, the sampling resistor R0, the first divider resistor R1 and the second divider resistor R2, the eighth filtering capacitor C81, and the ninth filtering capacitor C91. The wire of the current transformer 501 is connected to a power wire such as the fire line L in series, the induction coil is connected to the seventh filtering capacitor C71 in parallel, and the sampling resistor R0 is connected to the seventh filtering capacitor C71 in parallel. The seventh filtering capacitor C71 is configured to filter ultrahigh frequency interference, the sampling resistor R0 is configured to convert the current in the power wire to a voltage signal, and the ninth filtering capacitor C91 is configured to filter ultrahigh frequency interference of the preset power supply VCC. The resistance value of the first divider resistor R1 may be same as that of the second divider resistor R2. The first divider resistor R1 and the second divider resistor R2 are connected between the preset power supply VCC and the ground, such that a voltage at the node between the first divider resistor R1 and the second divider resistor R2 is VCC/2. The first divider resistor R1 and the second divider resistor R2 are connected to the first terminal of the induction coil via the eighth filtering capacitor C81, such that the current waveform may raise and the ADC collection by the control unit 60 such as an MCU may be allowed. The sixth filtering capacitor C61 is connected to the second terminal of the induction coil and near the ADC collecting port of the MCU so as to filter the high-frequency interference.

Therefore, with the apparatus for detecting an arc fault in a household appliance in this embodiment, the actual running current of the load may be sampled by the current transformer such that the current waveform may be sampled in real time precisely, reliably and with low cost. In addition, the collected electrical wave signal may be analyzed by the control unit 60, such that only the arc signal generated by the load is detected and the malfunction of the household appliance may be avoided efficiently.

According to the apparatus for detecting an arc fault in a household appliance of embodiments of the present disclosure, the arc signal in the outside power grid may be shielded by performing an attenuation processing with a filter protecting unit on the arc signal in the power grid. Thus, when the load current detecting unit detects the actual running current in the load of the household appliance via the current transformer, the arc signal in the outside power grid may not be detected and only the arc signal generated by the load may be detected, such that whether the arc fault exists may be determined without the influence of the outside power grid, thus avoiding the malfunction of the household appliance efficiently and reducing the influence for the user. Moreover, the current transformer in the load current detecting unit 50 adopts the current transformer to detect the actual running current of the load, such that the current waveform may be sampled in real time, precisely, reliably and with low cost, which ensures the accuracy of the arc fault detection.

Figure 5:
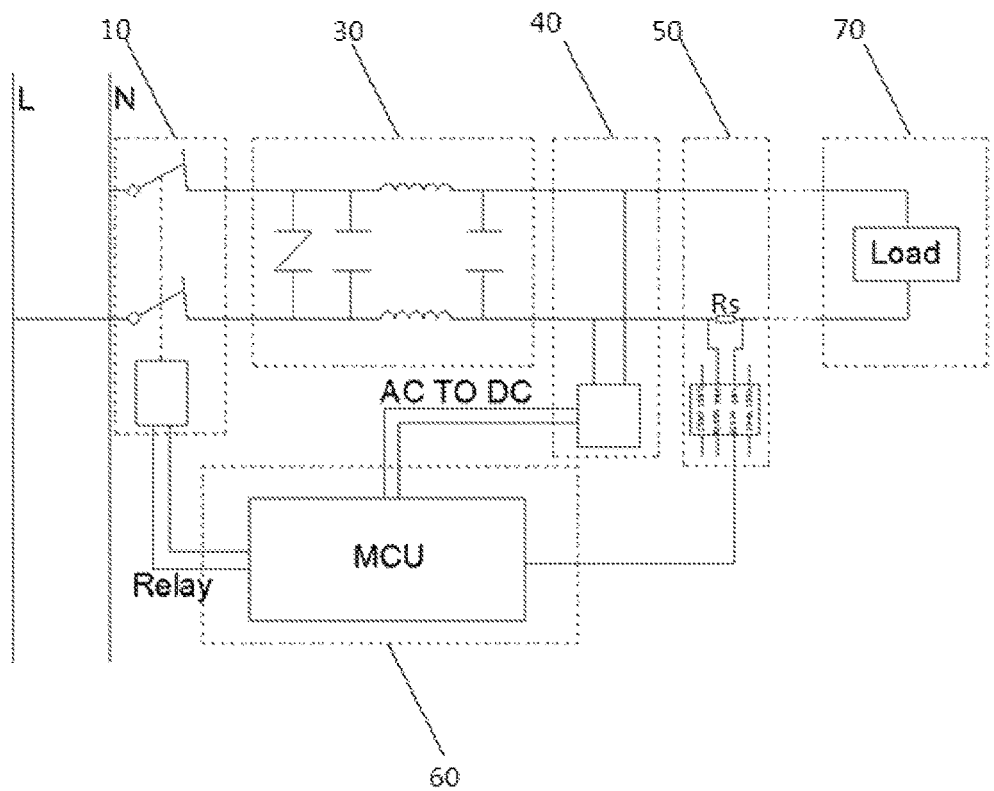
FIG. 5 is a schematic diagram of an apparatus for detecting an arc fault in a household appliance according to still another embodiment of the present disclosure.
Figure 6:
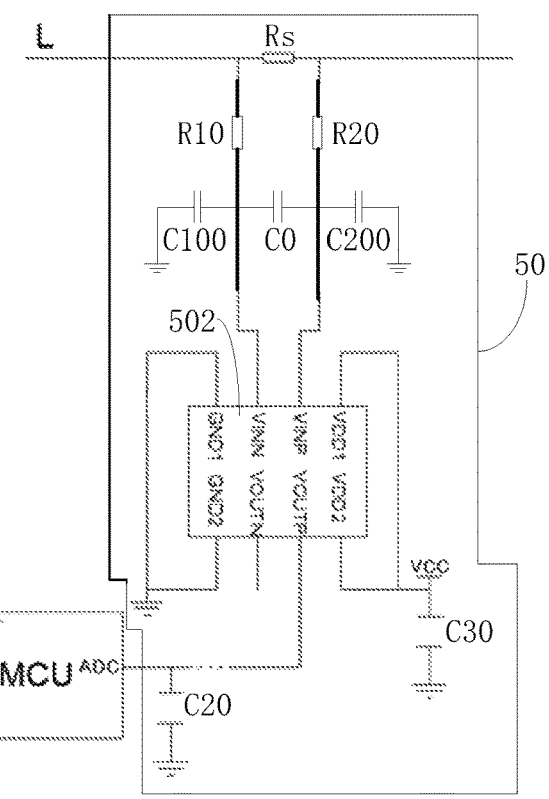
FIG. 6 is a schematic diagram showing a circuit of a load current detecting unit according to another embodiment of the present disclosure.

In another embodiment of the present disclosure, if the load current detecting unit 50 adopts a current detecting resistor, referring to FIG. 5 and FIG. 6, the apparatus includes a filter protecting unit 30, a load current detecting unit 50, a control unit 60, a controllable switch unit 10 and a switch power supply 40. As shown in FIG. 5, a front terminal of the release in the controllable switch unit 10 is connected to the fire line L and the neutral line N of the power grid, in which the release is a normally-closed contact, and the control coil is connected to the control unit 60. The front terminal (i.e., an input terminal) of the filter protecting unit 30 is connected to the release, a rear terminal (i.e., an output terminal) of the filter protecting unit 30 is connected to the switch power supply 40 and the load current detecting unit 50. The filter protecting unit 30 is configured to filter an arc interference signal in the power grid, which not only ensures a stable working of the switch power supply 40, but also prevents the load current detecting unit 50 from detecting the arc signal from the power grid.

As shown in FIG. 5, the output terminal of the switch power supply 40 is connected to the control unit 60 so as to supply power for the control unit 60. The load current detecting unit 50 is connected to the control unit 60, the rear terminal of the load current detecting unit 50 is connected to the load 70, the control unit 60 is configured to collect a load current signal via an ADC collecting port and to judge whether the arc fault exists by analyzing the current waveform. When detecting that the arc fault is generated by the load, the control unit 60 supplies power for the control coil. Thus, the release works to disconnect from the fire line and the neutral line, powering off the household appliance such as the air conditioner, and ensuring the security of the household appliance.

Therefore, with the apparatus for detecting an arc fault in a household appliance in this embodiment, the arc interference signal in the power grid may be filtered effectively by the filter protecting unit 30. Thus, only the arc signal generated by the load is detected without influence of the power grid, such that the malfunction of the household appliance may be avoided efficiently and the influence for the user may be reduced.

Further, as shown in FIG. 6, if the load current detecting unit 50 includes the current detecting resistor Rs, the load current detecting unit 50 further includes: a differential isolation amplifier 502 connected between two terminals of the current detecting resistor Rs, a second filtering capacitor C20 and a third filtering capacitor C30. The power terminal of the differential isolation amplifier 502 is connected to the preset power supply VCC, and the ground terminal of the differential isolation amplifier 502 is grounded. The first terminal of the second filtering capacitor C20 is connected to the control unit 60 and an output terminal of the differential isolation amplifier 502 respectively, and the second terminal of the second filtering capacitor C20 is grounded. The third filtering capacitor C30 is connected between the preset power supply VCC and the ground.

Moreover, according to an embodiment of the present disclosure, as shown in FIG. 6, the load current detecting unit 50 further includes a first common-mode filtering resistor R10, a second common-mode filtering resistor R20, a common-mode filtering capacitor C0, a first differential-mode filtering capacitor C100 and a second differential-mode filtering capacitor C200. The first terminal of the first common-mode filtering resistor R10 is connected to the first terminal of the current detecting resistor Rs, and the second terminal of the first common-mode filtering resistor R10 is connected to a first input terminal of the differential isolation amplifier 502. The first terminal of the second common-mode filtering resistor R20 is connected to the second terminal of the current detecting resistor Rs, and the second terminal of the second common-mode filtering resistor R20 is connected to a second input terminal of the differential isolation amplifier 502. The first terminal of the common-mode filtering capacitor C0 is connected to the second terminal of the first common-mode filtering resistor R10 and the first input terminal of the differential isolation amplifier 502 respectively, and the second terminal of the common-mode filtering capacitor C0 is connected to the second terminal of the second common-mode filtering resistor R2 and the second input terminal of the differential isolation amplifier 502. The first terminal of the first differential-mode filtering capacitor C100 is connected to the first terminal of the common-mode filtering capacitor C0, and the second terminal of the first differential-mode filtering capacitor C100 is grounded. The first terminal of the second differential-mode filtering capacitor C200 is connected to the second terminal of the common-mode filtering capacitor C0, and the second terminal of the second differential-mode filtering capacitor C200 is grounded.

In other words, in an embodiment of the present disclosure, the load current detecting unit 50 includes the current detecting resistor Rs, the first common-mode filtering resistor R10, the second common-mode filtering resistor R20, the common-mode filtering capacitor C0, the first differential-mode filtering capacitor C100, the second differential-mode filtering capacitor C200, the differential isolation amplifier 502, the second filtering capacitor C20 and the third filtering capacitor C30. The current detecting resistor Rs such as a non-inductance resistor is connected to a power wire such as the fire line L in series, the resistance value of the current detecting resistor Rs is very small and generally ranges from 5 m Ω to 50 m Ω. When there is current flowing through the current detecting resistor Rs, a tiny voltage difference will be generated across two terminals of the current detecting resistor Rs. The two terminals of the current detecting resistor Rs are connected to a VINP pin and a VINN pin of the differential isolation amplifier 502 respectively via the first common-mode filtering resistor R10, the second common-mode filtering resistor R20, the common-mode filtering capacitor C0, the first differential-mode filtering capacitor C100 and the second differential-mode filtering capacitor C200. Values of the first common-mode filtering resistor R10, the second common-mode filtering resistor R20, the common-mode filtering capacitor C0, the first differential-mode filtering capacitor C100 and the second differential-mode filtering capacitor C200 should be small, otherwise the sampled waveform may be distorted seriously.

In an embodiment of the present disclosure, the above filtering elements may be omitted in a PCB layout if the differential isolation amplifier 502 is very close to the current detecting resistor Rs.

As shown in FIG. 6, the third filtering capacitor C30 is connected between the preset power supply VCC and the ground, a VDD1 pin and a VDD2 pin of the differential isolation amplifier 502 are connected to the preset power supply VCC, a VOUTP pin of the differential isolation amplifier 502 is connected to the control unit 60 such as an ADC collecting port of an MCU. The second filtering capacitor C20 is connected near the ADC collecting port in parallel so as to filter high-frequency interference. A GND1 pin and a GND2 pin of the differential isolation amplifier 502 are grounded.

Therefore, with the apparatus for detecting an arc fault in a household appliance in this embodiment, the actual running current of the load may be sampled by the current detecting resistor, such that the current waveform may be sampled in real time, precisely, reliably and with low cost. In addition, the collected electrical wave signal may be analyzed by the control unit 60, such that only the arc signal generated by the load is detected and the malfunction of the household appliance may be avoided efficiently.

According to the apparatus for detecting an arc fault in a household appliance of embodiments of the present disclosure, the arc signal in the outside power grid may be shielded by performing an attenuation processing with a filter protecting unit on the arc signal in the power grid. Thus, when the load current detecting unit adopts the current detecting resistor and the differential isolation amplifier to detect the actual running current in the load of the household appliance, the arc signal in the outside power grid may not be detected, and only the arc signal generated by the load may be detected, such that whether the arc fault exists may be determined without the influence of the outside power grid, thus avoiding the malfunction of the household appliance efficiently and reducing the influence for the user. Moreover, the load current detecting unit 50 adopts the current detecting resistor and the differential isolation amplifier to detect the actual running current of the load, such that the current waveform may be sampled in real time, precisely, reliably and with low cost, which ensures the accuracy of the arc fault detection.

Figure 7:
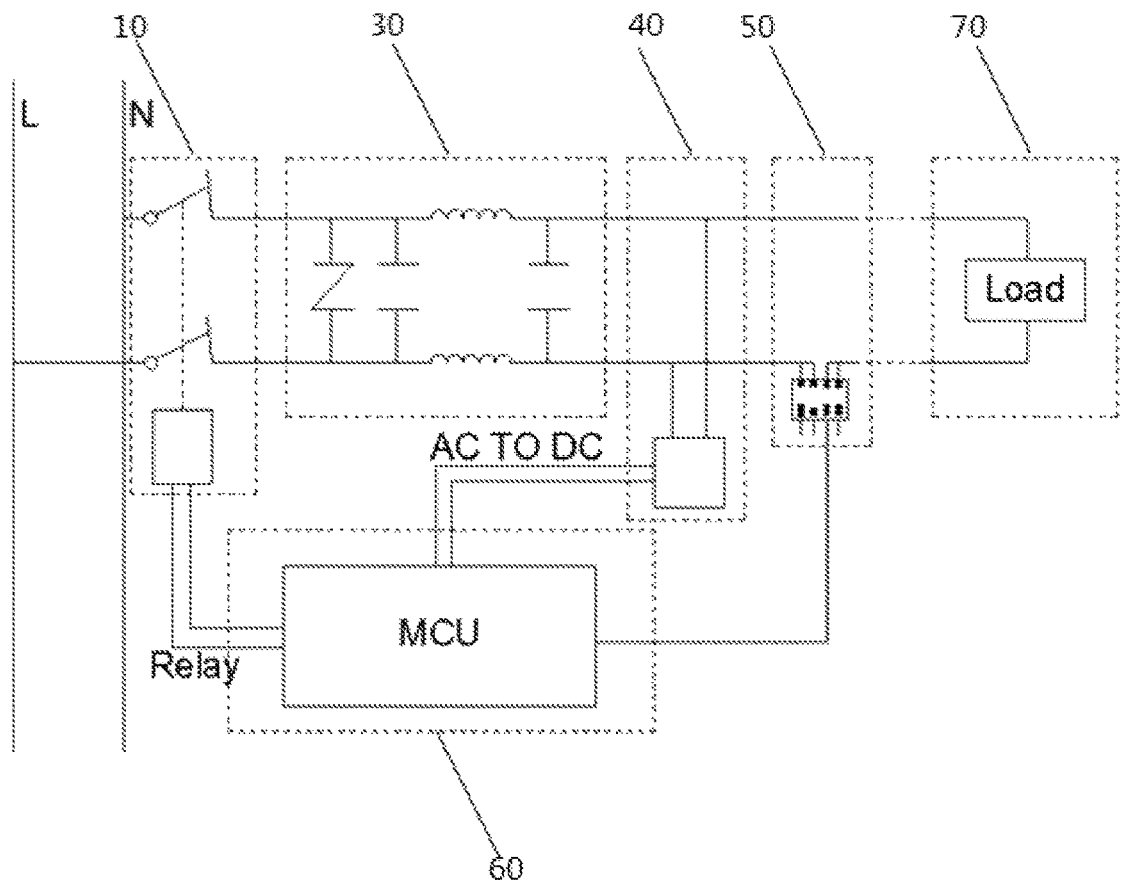
FIG. 7 is a schematic diagram of an apparatus for detecting an arc fault in a household appliance according to still yet another embodiment of the present disclosure.
Figure 8:
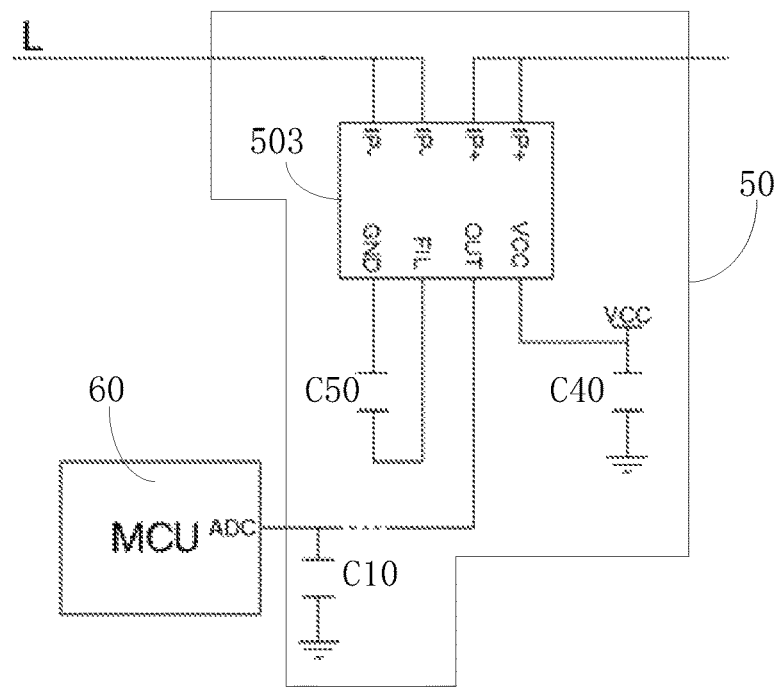
FIG. 8 is a schematic diagram showing a circuit of a load current detecting unit according to yet another embodiment of the present disclosure.

In yet another embodiment of the present disclosure, when the load current detecting unit 50 adopts a Hall current detecting chip, referring to FIG. 7 and FIG. 8, the apparatus includes a filter protecting unit 30, a load current detecting unit 50, a control unit 60, a controllable switch unit 10 and a switch power supply 40. As shown in FIG. 7, a front terminal of the release in the controllable switch unit 10 is connected to the fire line L and the neutral line N of the power grid, in which the release is a normally-closed contact, and the control coil is connected to the control unit 60. The front terminal (i.e., an input terminal) of the filter protecting unit 30 is connected to the release, a rear terminal (i.e., an output terminal) of the filter protecting unit 30 is connected to the switch power 40 and the load current detecting unit 50. The filter protecting unit 30 is configured to filter an arc interference signal in the power grid, which not only ensures a stable working of the switch power supply 40, but also prevents the load current detecting unit 50 from detecting the arc signal from the power grid.

As shown in FIG. 7, the output terminal of the switch power supply 40 is connected to the control unit 60 so as to supply power for the control unit 60. The load current detecting unit 50 is connected to the control unit 60, the rear terminal of the load current detecting unit 50 is connected to the load 70, the control unit 60 is configured to collect a load current signal via an ADC collecting port and to judge whether the arc fault exists by analyzing the current waveform. When detecting that the arc fault is generated by the load, the control unit 60 supplies power for the control coil, such that the release works to disconnect from the neutral line and the fire line, powering off the household appliance such as the air conditioner, and ensuring the security of the household appliance.

Therefore, with the apparatus for detecting an arc fault in a household appliance in this embodiment, the arc interference signal in the power grid may be filtered effectively by the filter protecting unit 30. Thus, only the arc signal generated by the load is detected without influence of the power grid, such that the malfunction of the household appliance may be avoided efficiently and the influence for the user may be reduced.

Further, as shown in FIG. 8, when the load current detecting unit 50 includes the Hall current detecting chip 503, the load current detecting unit 50 further includes: a first filtering capacitor C10, a fourth filtering capacitor C40 and a fifth filtering capacitor C50. The first terminal of the first filtering capacitor C10 is connected to the control unit 60 and the output terminal of the Hall current detecting chip 503 respectively, and the second terminal of the first filtering capacitor C10 is grounded. The fourth filtering capacitor C40 is connected between a preset power supply VCC and the ground, in which the preset power supply VCC is connected to a power terminal of the Hall current detecting chip 503. The fifth filtering capacitor C50 is connected between a filtering terminal of the Hall current detecting chip 503 and a ground terminal of the Hall current detecting chip 503.

In other words, the load current detecting unit 50 includes the Hall current detecting chip 503, the fifth filtering capacitor C50, the first filtering capacitor C10 and the fourth filtering capacitor C40. An IP- pin and an IP+ pin of the Hall current detecting chip 503 are connected to a power wire such as the fire line L in series, and a load current flows through a Hall sensor in the chip. A VCC pin of the Hall current detecting chip 503 is connected to the preset power supply VCC so as to supply power for the chip. The fourth filtering capacitor C40 is connected between the preset power supply VCC and the ground so as to realize a power supply decoupling. The fifth filtering capacitor C50 is connected to an FIL pin and a GND pin of the Hall current detecting chip 503 in parallel so as to realize a primary filtering. A voltage signal of 0.5 V~(VCC-0.5 V) is output via an OUT pin of the Hall current detecting chip 503 and is proportional to a collected instantaneous current, and the voltage is VCC/2 when the current changes over zero. The OUT pin is connected to the control unit 60 such as the ADC collecting port of an MCU, and the first filtering capacitor C10 is connected near the ADC collecting port in parallel so as to filter high-frequency interference.

Therefore, with the apparatus for detecting an arc fault in a household appliance in this embodiment, the actual running current of the load may be sampled by the Hall current detecting chip such that the current waveform may be sampled in real time, precisely, reliably and with low cost. In addition, the collected electrical wave signal may be analyzed by the control unit 60, such that only the arc signal generated by the load is detected and the malfunction of the household appliance may be avoided efficiently.

According to the apparatus for detecting an arc fault in a household appliance of embodiments of the present disclosure, the arc signal in the outside power grid may be shielded by performing an attenuation processing with a filter protecting unit on the arc signal in the power grid. Thus, when the Hall current detecting chip in the load current detecting unit detects the actual running current in the load of the household appliance, the arc signal in the outside power grid is not detected and only the arc signal generated by the load may be detected, such that whether the arc fault exists may be determined without the influence of the outside power grid, avoiding the malfunction of the household appliance efficiently and reducing the influence for the user. Moreover, the actual running current of the load may be detected by the Hall current detecting chip applied in the load current detecting unit, such that the current waveform may be sampled in real time, precisely, reliably and with low cost, which ensures the accuracy of the arc fault detection.

Figure 9:
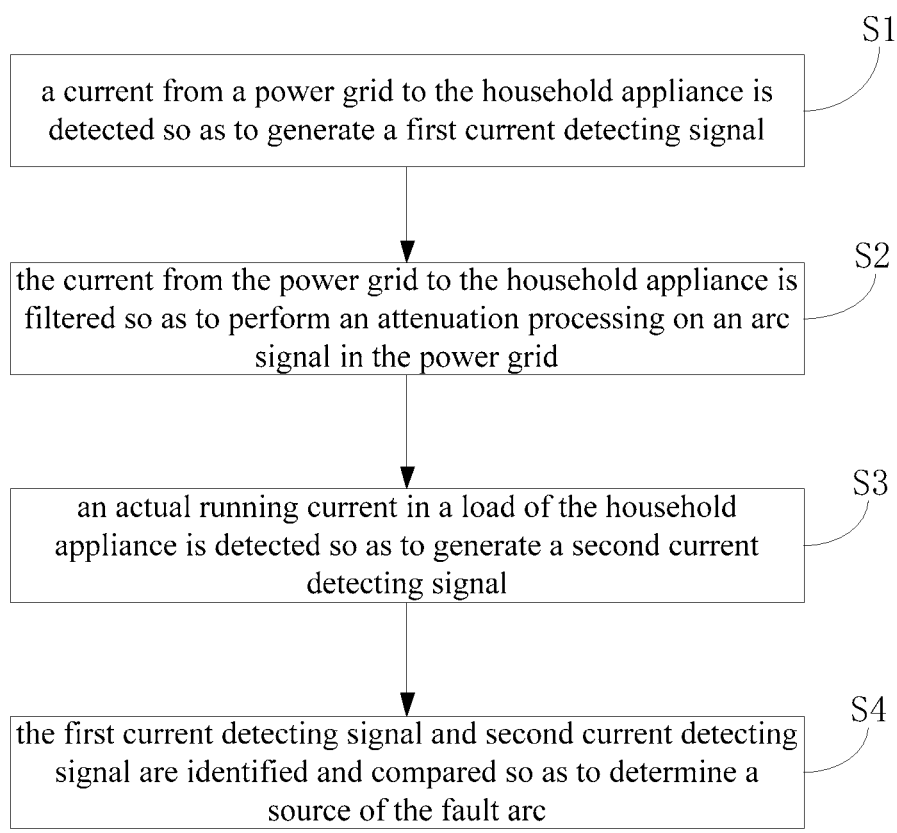
FIG. 9 is a flow chart of a method for detecting an arc fault in a household appliance according to an embodiment of the present disclosure.

FIG. 9 is a flow chart of a method for detecting an arc fault in the household appliance according to an embodiment of the present disclosure. As shown in FIG. 9, the method includes following acts.

In act S1, a current flowing to the household appliance from a power grid is detected so as to generate a first current detecting signal.

A waveform of the current flowing to the household appliance from the power grid may be detected by a grid current detecting unit.

In act S2, the current flowing to the household appliance from the power grid is filtered so as to perform an attenuation processing on an arc signal in the power grid.

The current from the power grid to the household appliance may be filtered by a filtering protecting unit.

In act S3, an actual running current in a load of the household appliance is detected so as to generate a second current detecting signal.

A waveform of the actual running current in the load of the household appliance may be detected by a load current detecting unit.

In act S4, the first current detecting signal and second current detecting signal are identified and compared so as to determine a source of the arc fault.

According to an embodiment of the present disclosure, act S4 includes: identifying a first arc signal according to the first current detecting signal, and identifying a second arc signal according to the second current detecting signal; determining that the arc fault is generated by the power grid if a strength of the first arc signal is greater than that of the second arc signal; and determining that the arc fault is generated by the load if the strength of the first arc signal is less than that of the second arc signal.

In other words, in embodiments of the present disclosure, the current waveform generated from the power grid and detected by the grid current detecting unit 20 is compared with the current waveform generated from the load and detected by the load current detecting unit 50. It is determined that the arc fault is generated by the outside power grid if the arc signal in the current waveform generated from the power grid and detected by the grid current detecting unit 20 is stronger than the arc signal in the current waveform generated from the load and detected by the load current detecting unit 50, otherwise, it is determined that the arc fault is generated by the inside load. Therefore, the source of the arc fault may be determined precisely.

Moreover, if the art fault is generated by the load, the household appliance is further controlled to be powered off, such that the security of the household appliance may be ensured.

With the method for detecting an arc fault in a household appliance according to embodiments of the present disclosure, a current from a power grid to the household appliance may be detected to generate a first current detecting signal and an actual running current in a load of the household appliance may be detected to generate a second current detecting signal, in which an attenuation processing is performed on the arc signal in the power grid. In this way, the first current detecting signal and second current detecting signal may be identified and compared, which means that the current waveform from the power grid may be compared with the actual current waveform of the load of the household appliance. Thus, a source of the arc fault may be determined precisely, i.e., it may be judged whether the arc fault is generated by the outside power grid or the inside load, such that the malfunction of the household appliance may be avoided efficiently and the influence for the user may be reduced.

Moreover, embodiments of the present disclosure also provide a household appliance, including the apparatus for detecting an arc fault in a household appliance mentioned above.

With the household appliance provided in the present disclosure, the current waveform from the power grid and the actual current waveform of the load of the household appliance may be compared by the above-described apparatus, such that a source of the arc fault may be determined precisely, which means that it may be determined whether the arc fault is generated by the outside power grid or the inside load, such that the malfunction may be avoided efficiently and the influence for the user may be reduced.

In the specification, it is to be understood that terms such as "central," "longitudinal," "lateral," "length," "width," "thickness," "upper," "lower," "front," "rear," "left," "right," "vertical," "horizontal," "top," "bottom," "inner,"

"outer," "clockwise," "counterclockwise," "axial," "radial," and "circumferential" should be construed to refer to the orientation as then described or as shown in the drawings under discussion. These relative terms are for convenience of description and do not require that the present disclosure be constructed or operated in a particular orientation.

In addition, terms such as "first" and "second" are used herein for purposes of description and are not intended to indicate or imply relative importance or significance or to imply the number of indicated technical features. Thus, the feature defined with "first" and "second" may comprise one or more of this feature. In the description of the present disclosure, "a plurality of" means two or more than two, unless specified otherwise.

In the present disclosure, unless specified or limited otherwise, the terms "mounted," "connected," "coupled," "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. An apparatus for detecting an arc fault in a household appliance, comprising:

a grid current detecting unit, connected to a power terminal of the household appliance and, configured to detect a current flowing to the household appliance from a power grid so as to generate a first current detecting signal;

a filter protecting unit, configured to perform an attenuation processing on a first arc signal in the power grid so that the first arc signal in the power grid is shielded, the filter protecting unit connected to the grid current detecting unit;

a load current detecting unit, configured to detect an actual running current in a load of the household appliance so as to generate a second current detecting signal, a rear terminal of the load current detecting unit connected to the load, wherein the actual running current is not shielded by the filter protecting unit;

a control unit, connected to the grid current detecting unit and the load current detecting unit respectively, and configured to identify and compare the first current detecting signal and second current detecting signal so as to determine a source of the arc fault, including:

identifying the first arc signal according to the first current detecting signal;

identifying a second arc signal according to the second current detecting signal;

in accordance with a determination that the strength of the first arc signal is greater than that of the second arc signal, determining the source of the arc fault as being generated by the power grid; and in accordance with a determination that the strength of the first arc signal is less than that of the second arc signal, determining the source of the arc fault as being generated by the load;

a controllable switch unit, wherein a first terminal of the controllable switch unit is configured to be connected to the power grid, a second terminal of the controllable switch unit is connected to an input end of the filter protecting unit, an output end of the filter protecting unit is connected to the load, a control terminal of the controllable switch unit is connected to the control unit, and the control unit is further configured to control the controllable switch unit to switch off if the arc fault is generated by the load, so as to enable the household appliance to be powered off; and a switch power supply, wherein an input terminal of the switch power supply is connected to the output end of the filter protecting unit, and wherein the switch power supply is configured to perform an AC/DC conversion and to supply a direct current to the control unit.

2. The apparatus according to claim 1, wherein, the controllable switch unit comprises a relay comprising a release and a control coil, the release is connected to a fire line and a neutral line of the power grid respectively, the control coil is connected to the control unit, and the release is a normally-closed contact.

3. The apparatus according to claim 1, wherein, the filter protecting unit comprises a low pass filter, the low pass filter is one selected from the group consisting of an LC filter circuit, an LCL filter circuit, a CLC filter circuit and a CLLC filter circuit.

4. The apparatus according to claim 3, wherein, the CLC filter circuit further comprises:

a first X capacitor, connected between a fire line and a neural line of the power grid in parallel;

a first differential mode inductor, wherein a first terminal of the first differential mode inductor is connected to a first terminal of the first X capacitor; and a second X capacitor, connected between a second terminal of the first differential mode inductor and a second terminal of the first X capacitor, wherein two terminals of the second X capacitor are configured as the output end of the filter protecting unit.

5. The apparatus according to claim 4, wherein, the filter protecting unit further comprises a first piezoresistor configured to prevent a surge, connected between the fire line and a neutral line of the power grid in parallel, and connected to the first X capacitor in parallel.

6. The apparatus according to claim 3, wherein, the CLLC filter circuit further comprises:

a third X capacitor, connected between a fire line and a neutral line of the power grid in parallel;

a second differential mode inductor, wherein a first terminal of the second differential mode inductor is connected to a first terminal of the third X capacitor;

a third differential mode inductor, wherein a first terminal of the third differential mode inductor is connected to a second terminal of the third X capacitor; and a fourth X capacitor, connected between a second terminal of the second differential mode inductor and a second terminal of the third differential mode inductor, wherein two terminals of the fourth X capacitor are configured as the output end of the filter protecting unit.

7. The apparatus according to claim 6, wherein, the filter protecting unit further comprises a second piezoresistor configured to prevent a surge, connected between the fire line and the neutral line of the power grid in parallel and connected to the third X capacitor in parallel.

8. The apparatus according to claim 1, wherein, a circuit configuration of the grid current detecting unit is the same as the circuit configuration of the load current detecting unit.

9. The apparatus according to claim 8, wherein, the load current detecting unit further comprises one selected from the group consisting of a current transformer, a current detecting resistor, and a Hall current detecting chip.

10. The apparatus according to claim 9, wherein, when the load current detecting unit comprises a Hall current detecting chip, the load current detecting unit further comprises:

a first filtering capacitor, wherein a first terminal of the first filtering capacitor is connected to the control unit and an output terminal of the Hall current detecting chip respectively, and a second terminal of the first filtering capacitor is grounded;

a fourth filtering capacitor connected between a preset power supply and ground, wherein the preset power supply is connected to a power terminal of the Hall current detecting chip; and a fifth filtering capacitor connected between a filtering terminal of the Hall current detecting chip and a ground terminal of the Hall current detecting chip.

11. The apparatus according to claim 9, wherein, when the load current detecting unit comprises the current detecting resistor, the load current detecting unit further comprises:

a differential isolation amplifier connected between two terminals of the current detecting resistor, wherein a power terminal of the differential isolation amplifier is connected to a preset power supply, and a ground terminal of the differential isolation amplifier is grounded;

a second filtering capacitor, wherein a first terminal of the second filtering capacitor is connected to the control unit and an output terminal of the differential isolation amplifier respectively, and a second terminal of the second filtering capacitor is grounded; and a third filtering capacitor connected between the preset power supply and ground.

12. The apparatus according to claim 9, wherein, the load current detecting unit further comprises:

a first common-mode filtering resistor, wherein a first terminal of the first common-mode filtering resistor is connected to a first terminal of the current detecting resistor, and a second terminal of the first common-mode filtering resistor is connected to a first input terminal of the differential isolation amplifier;

a second common-mode filtering resistor, wherein a first terminal of the second common-mode filtering resistor is connected to a second terminal of the current detecting resistor, and a second terminal of the second common-mode filtering resistor is connected to a second input terminal of the differential isolation amplifier;

a common-mode filtering capacitor, wherein a first terminal of the common-mode filtering capacitor is connected to the second terminal of the first common-mode filtering resistor and the first input terminal of the differential isolation amplifier respectively, and a second terminal of the common-mode filtering capacitor is connected to the second terminal of the second common-mode filtering resistor and the second input terminal of the differential isolation amplifier respectively;

a first differential-mode filtering capacitor, wherein a first terminal of the first differential-mode filtering capacitor is connected to the first terminal of the common-mode filtering capacitor, and a second terminal of the first differential-mode filtering capacitor is grounded; and a second differential-mode filtering capacitor, wherein a first terminal of the second differential-mode filtering capacitor is connected to the second terminal of the common-mode filtering capacitor, and a second terminal of the second differential-mode filtering capacitor is grounded.

13. The apparatus according to claim 9, wherein, when the load current detecting unit comprises a current transformer, the load current detecting unit further comprises:

a sixth filtering capacitor connected to an induction coil of the current transformer in parallel, wherein the current transformer is connected to a fire line of the power grid in series;

a sampling resistor connected to the sixth filtering capacitor in parallel;

a first divider resistor and a second divider resistor, wherein the first divider resistor and the second divider resistor are connected in series and are connected between a preset power supply and a ground, a node between the first divider resistor and the second divider resistor is connected to a first terminal of the sampling resistor, and a second terminal of the sampling resistor is connected to the control unit; and a seventh filtering capacitor connected to the second divider resistor in parallel.

14. The apparatus according to claim 13, wherein, the load current detecting unit further comprises:

an eighth filtering capacitor, wherein a first terminal of the eighth filtering capacitor is connected to the control unit and the second terminal of the sampling resistor respectively, and a second terminal of the eighth filtering capacitor is grounded; and a ninth filtering capacitor connected between the preset power supply and the ground so as to be connected in parallel to the first divider resistor and the second divider resistor connected in series.

15. The apparatus according to claim 13, wherein, a resistance value of the first divider resistor is the same as that of the second divider resistor.

\* \* \* \* \*